United States Patent [19]
Lowther

[11] Patent Number: 5,717,243
[45] Date of Patent: Feb. 10, 1998

[54] INTEGRATED CIRCUIT WITH AN IMPROVED INDUCTOR STRUCTURE AND METHOD OF FABRICATION

[75] Inventor: Rex Everett Lowther, Palm Bay, Fla.

[73] Assignee: Harris Corporation, Palm Bay, Fla.

[21] Appl. No.: 637,132

[22] Filed: Apr. 24, 1996

[51] Int. Cl.[6] .................................................. H01L 29/00
[52] U.S. Cl. ........................................ 257/531; 257/528
[58] Field of Search ............................................. 257/531

[56] References Cited

U.S. PATENT DOCUMENTS

| | | | |
|---|---|---|---|
| 5,446,311 | 8/1995 | Ewen et al. | 257/531 |
| 5,610,433 | 3/1997 | Merrill et al. | 257/531 |

OTHER PUBLICATIONS

"Design of Impedance–Matching Networks", Microwave Lumped Elements, pp. 245–274.

D. Lovelace, N. Camilleri, and G. Kannell, "Silicon MMIC Inductor Modeling For High Volume, Low Cost Application", Microwave Journal, Aug. 1994, pp. 60–71.

I. Wolff and H. Kapusta, "Modeling of Circular Spiral Inductors for MMICs", IEEE MTT-S Digest, 1987, pp. 123–125.

"Substrate", pp. 13–4–13–5; Inductor, Center–Fed Rectangular Spiral, pp. 13–58–13–59; Inductor, Side–Fed Rectangular Spiral, pp. 13–60–13–61; Inductor, Round Spiral, pp. 13–62–13–63, Microstrip Connection.

*Primary Examiner*—Gene M. Munson
*Attorney, Agent, or Firm*—Jaeckle Fleischmann & Mugel, LLP

[57] ABSTRACT

An integrated circuit with an inductor structure includes a semiconductor device substrate. Over the semiconductor device substrate is a dielectric layer, and over the dielectric layer is a metal spiral inductor. The metal spiral is formed by a continuous metal strip. The continuous metal strip has at one end a center and then increases in a radial direction to its other end. The metal spiral carries current between its two ends and generates radial and circumferential parasitic currents in the substrate. In the substrate are a plurality of separated radial doped strips about a central axis. Each of these radial doped strips define a region of relative low resistivity to reduce the resistance to the radial current flow in the device substrate. These strips are separated by regions having relatively high resistivity to substantially maintain the resistance to the circumferential current flow in the substrate. The integrated circuit may also have a metal line extending over the dielectric layer in an incomplete ring around the outer circumference of the metal spiral. This metal line is coupled to at least one site of each of the doped strips and connected either to ground or to the outer end of the metal spiral. Instead of the metal line, the inner end of the metal spiral may be connected to the doped strips. This inductor structure provides a lower resistive or real part of the impedance of the metal spiral, reducing power loss and increasing the Q of the metal spiral.

25 Claims, 9 Drawing Sheets

INTEGRATED CIRCUIT WITH AN IMPROVED INDUCTOR STRUCTURE AND METHOD OF FABRICATION

FIELD OF THE INVENTION

The present invention relates to an integrated circuit with an improved inductor structure.

BACKGROUND OF THE INVENTION

To understand the performance of an inductor, reference will be made to FIG. 1, which shows a cross-sectional view of a general inductor structure 18 on a bonded wafer comprising a device layer 14 over a handle substrate 10. Device layer 14 may have an upper epitaxial layer 13. A bottom silicon oxide layer 12 is disposed between device layer 14 and handle substrate 10. Over device layer 14 is a metal spiral inductor 18 and between device layer 14 and metal spiral 18 is a silicon oxide layer 16. Metal spiral inductor 18 is formed by a continuous metal strip having several turns.

The conventional measure of inductor performance is called the Quality Factor or "Q". Q is defined herein as $Im(Z)/Re(Z)$, where $Im(Z)$ is the imaginary part of the impedance of an inductor and $Re(Z)$ is the real or resistive part of the impedance of an inductor. Generally, $Im(Z)$ represents the inductance minus the capacitance of the inductor structure, while $Re(Z)$ represents a value determined by the sum of the structure's resistive losses. The value of Q varies with the frequency of the electrical signal being carried in metal spiral 18. A high performing inductor has a high Q when it has an impedance with a high imaginary part and a low real part. Q is decreased by several parasitics in the inductor structure. These parasitics and their effects on Q will be described in reference to FIG. 2, a lumped-element model of the inductor structure. In this model, nodes A and B represent the inner and outer ends of metal spiral 18 and $L_m$ represents the inductance of metal spiral 18.

There are two general types of parasitics represented in FIG. 2. The first type are parasitic capacitances, generally in parallel with metal spiral 18, to both device layer 14 and handle substrate 10. $C_{md1}$ and $C_{md2}$ represent the parasitic capacitances from device layer 14 to the outer and inner turns of metal spiral 18. $C_{ds1}$ and $C_{ds2}$ represent the parasitic capacitances between device layer 14 and substrate 10 below the outer and inner turns of metal spiral 18. Parasitic capacitances are a problem because they reduce the imaginary part of the impedance, $Im(Z)$, thereby reducing Q. The second type of parasitics are parasitic resistances due to currents flowing through any of the resistances in the model, such resistances are denoted by "$R_p$". Parasitic resistances are also a problem because they increase the real part of the impedance, $Re(Z)$, thereby reducing Q. This reduction in Q caused by these parasitic resistances may be represented by power dissipation (P) or signal losses to metal spiral 18 by the formula: $P=I_p^2 R_p$, where $I_p$ is the current through parasitic resistance $R_p$. These parasitic resistances are discussed below in reference to FIG. 2.

$R_m$ represents the parasitic metal resistance in metal spiral 18. This parasitic resistance is in series with $L_m$, and is determined by the characteristics of metal spiral 18.

$R_{Lsd}$ represents the resistance to the flow of circumferential current inductively induced by metal spiral 18 in both substrate 10 and device layer 14. $R_{Lsd}$ is serially connected to "image inductor" $L_{sd}$. $L_{sd}$ represents the inductance of this circumferential current in both substrate 10 and device layer 14. Mutual coupling between $L_m$ and $L_{sd}$ creates an induced voltage difference (EMF) across $L_{sd}$ that drives current through $R_{Lsd}$. The power loss due to this induced circumferential current equals $EMF^2/R_{Lsd}$. Since this EMF is independent of $R_{Lsd}$, the current through $R_{Lsd}$ is inversely proportional to $R_{Lsd}$. Thus, as $R_{Lsd}$ decreases, the induced circumferential current and power loss through $R_{Lsd}$ increases, and Q decreases because the real part of impedance $Re(Z)$ increases. Further, in addition to the effect of $R_{Lsd}$ on Q, Q is also reduced by $L_{sd}$ because $L_{sd}$ produces a magnetic field that opposes the magnetic field of metal spiral 18 and thus $L_{sd}$ subtracts from the imaginary part of the impedance of metal spiral 18, $Im(Z)$. Also, note that $L_{sd}$ and $R_{Lsd}$ are shown together in a separate (aside from the mutual inductor coupling) circuit in FIG. 2. This is because the induced circumferential current only flows circular and parallel to the surface or plane of metal spiral 18 and has no radial or vertical component.

$R_d$ represents the resistance to radial current generated in device layer 14 due to capacitive coupling with metal spiral 18. This current flows through device layer 14. In metal spiral 18, the inner and outer turns are at different potentials due both inductance $L_m$ of metal spiral 18 and metal resistance $R_m$. At high frequencies, device layer 14 closely tracks the potentials in the above turns of metal spiral 18. In the model, the capacitive coupling, shown by capacitors $C_{md1}$ and $C_{md2}$, substantially transfer the voltages at node A ($V_A$) and at node B ($V_B$) down into device layer 14. This creates a corresponding potential difference of about $V_A-V_B$ in device layer 14 below the inner and outer turns of metal spiral 18 (or across $R_d$). This current is radial in direction because it flows radially in device layer 14 between the inner and outer turns of metal spiral 18.

Another radial current is similarly generated by metal spiral 18 in substrate 10 due to capacitive coupling with $C_{ds1}$ and $C_{ds2}$. The parasitic resistance to this radial current is represented by $R_s$.

The remaining parasitic resistances in the model represent resistance of parasitic currents flowing between device layer 14 and ground and between substrate 10 and ground. Ground is typically a reference voltage in the integrated circuit. Often the bottom of substrate 10 is at ground. Specifically, $R_{gd1}$ and $R_{gd2}$ represent the parasitic resistances to metal spiral 18 due to parasitic current flowing between the ground and device layer 14 below the outer and inner turns of metal spiral 18. $R_{gs1}$ and $R_{gs2}$ represent the parasitic resistances to metal spiral 18 due to parasitic current flowing between the ground and substrate 10 below the outer and inner turns of metal spiral 18. The notation $R_{gs}$ will be used to refer to both $R_{gs1}$ and $R_{gs2}$. Likewise, $R_{gd}$ will be used to refer to both $R_{gd1}$ and $R_{gd2}$.

The present invention is directed to reducing certain of the above parasitic resistances, such as $R_d$, to improve inductor performance. There are two general approaches to affect parasitic resistances in the device layer or handle substrate below a spiral inductor on an IC. The first approach involves increasing the substrate resistance to a level such that currents through $R_s$, $R_{Lsd}$, and $R_{gs}$ are very small. This requires a highly resistive wafer for the handle substrate. Since these parasitic currents cannot flow through such a high resistivity, they disappear as do the power loss they create. The problem with this first approach is that highly resistive wafers are very expensive and greatly increase manufacturing costs.

The second approach is to substantially reduce the device layer resistivity to allow the radial current to flow more freely through $R_d$ by reducing $R_d$. This can be obtained with high doping concentrations in device layer 14. This not only reduces power loss through $R_d$, but also through $R_s$ because the radial currents in handle substrate 10 will be short-circuited by device layer 14. The problem with this second approach is that because $R_{Lsd}$ depends on the resistivity of handle substrate 10 and device layer 14, the above doping to reduce $R_d$ makes $R_{Lsd}$ too small. Due to the inverse relationship between the induced circumferential current and $R_{Lsd}$, as described earlier, a small $R_{Lsd}$ greatly increases the induced circumferential current and the power loss through $R_{Lsd}$. In addition, since the magnetic field of $L_{sd}$ increases in response to the increase circumferential current and such field opposes the magnetic field of the metal spiral 18, the imaginary part of the impedance of metal spiral 18 is reduced. Both effects negatively impact Q and compromise the benefit of reducing device layer 14 resistivity. Thus, this second approach is unacceptable.

Therefore, the semiconductor industry has had to tolerate inductors with low Q levels and high power losses due to parasitic resistances in the handle substrate and the device layer.

SUMMARY OF THE INVENTION

Accordingly, an object of the present invention is to provide an integrated circuit with an improved inductor structure which increases Q by reducing power loss through certain parasitic resistances, including $R_d$ and $R_s$, without significantly increasing power loss through $R_{Lsd}$ or requiring highly resistive wafers. A still further object of the present invention is to provide an integrated circuit with an improved inductor structure which increases Q by reducing $R_{gd}$ to decrease the power loss of the inductor through $R_{gd}$ and $R_{gs}$.

Another object of the present invention is to provide an integrated circuit with an improved inductor structure which allows radial current flow in silicon layers, such as the device layer and substrate, without significantly reducing resistance to circumferential current flow in those layers.

Briefly described, the present invention provides an integrated circuit with an inductor structure having a semiconductor device substrate, such as a device layer. Over the semiconductor device substrate is a dielectric layer, such as silicon oxide, and over the dielectric layer is a metal spiral provided by a continuous metal strip. The continuous metal strip has a spiral shape with two ends called the inner and outer ends. The metal spiral carries current between its two ends and generates parasitic radial and circumferential currents in the underlying semiconductor layer(s). In the semiconductor device layer are a plurality of doped radial strips about a central axis. Each of these doped radial strips define a region of relative low resistivity to reduce the resistance to the radial current flow in the semiconductor device substrate. Further, these strips are separated by regions having relatively high resistivity to substantially maintain the resistance to the circumferential current flow in the semiconductor device substrate. The inductor structure may have a handle substrate bonded to the semiconductor device substrate as in FIG. 1.

Further in accordance with the present invention, $R_d$, resistance to radial flow in the device layer, is sufficiently reduced that power dissipation through $R_d$ is reduced, thereby increasing the Q of the metal spiral.

The integrated circuit may also have a metal line extending over the dielectric layer in an incomplete ring around an outer circumference of the metal spiral. This metal line is electrically connectable to the ground reference voltage of the IC and has at least one connection with each of the doped strips in the semiconductor device substrate. The metal line couples at least one site of the doped strips to a voltage level at or near ground to reduce resistance to parasitic current flowing in the semiconductor device substrate to ground, such as represented by $R_{gd}$. The metal line is sufficient to lower the resistive part of the impedance in the inductor structure of the metal spiral, thereby increasing Q. In another embodiment, the above metal line, instead of being connected to a ground reference voltage, is connected to the outer end of the metal spiral for coupling at least one site of each of the doped strips to a voltage level near ground to reduce parasitic current flowing through $R_{gd}$ and $R_{gs}$ to ground. In is assumed here that the outer end of the spiral has a voltage near ground. In still a further embodiment, instead of the metal line, a connection is made from the inner end of the metal spiral to the doped strips for coupling at least one of the doped strips to a voltage level near ground to reduce parasitic current flowing through $R_{gd}$ and $R_{gs}$ to ground. In this case, it is assumed that the inner end of the spiral has a voltage close to ground.

The invention is further directed to a method for fabricating the above integrated circuit with an inductor structure having a semiconductor substrate, which comprises: masking the semiconductor substrate with a first mask to define exposed radial strips about a central axis extending through the semiconductor substrate; doping the exposed radial strips to create adjacent regions of low resistivity and high resistivity; removing the first mask; forming a dielectric layer over the semiconductor substrate; depositing a metal layer over the region of low and high resistivity; patterning the metal layer into an inductive spiral; and forming contacts to the metal spiral.

The method may further comprise: forming a reference voltage contact over the dielectric layer; forming apertures in the dielectric layer; depositing metal in the apertures to contact the doped strips in the semiconductor substrate; forming a metal line over the dielectric layer which is shaped in an incomplete ring around the outer circumference of the metal spiral and has a plurality of connections along the incomplete ring to the metal deposited in the apertures; and connecting the metal line with the reference voltage contact.

BRIEF DESCRIPTION OF THE DRAWINGS

The present invention will be better understood and appreciated more fully from the following detailed description, taken in conjunction with the accompanying drawings, in which.

DETAILED DESCRIPTION OF THE INVENTION

Figure 1:
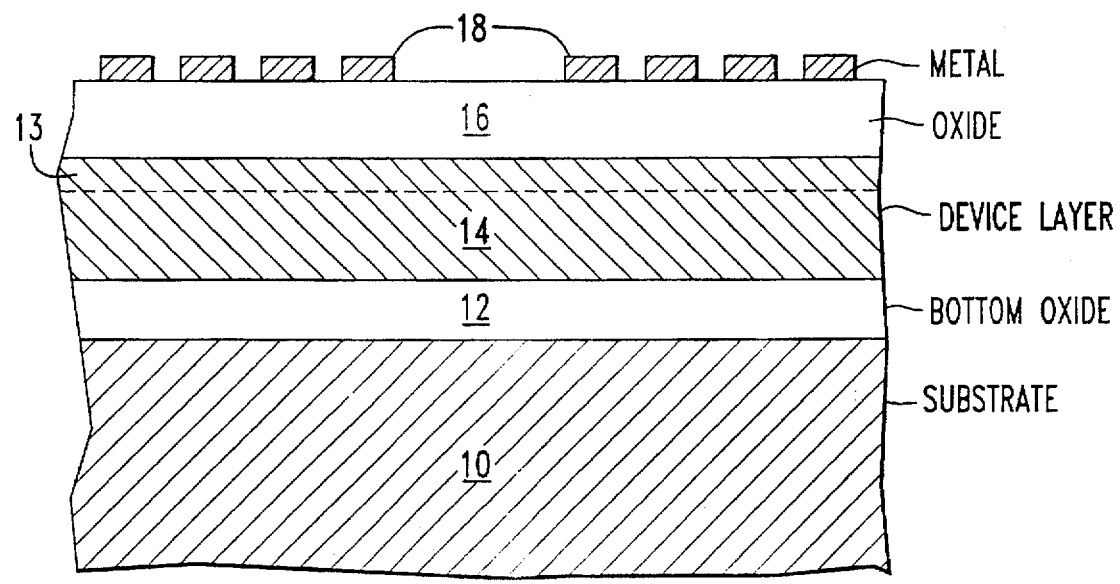
FIG. 1 is a cross-sectional diagram of an integrated circuit with an inductor structure of the prior art.
Figure 3A:
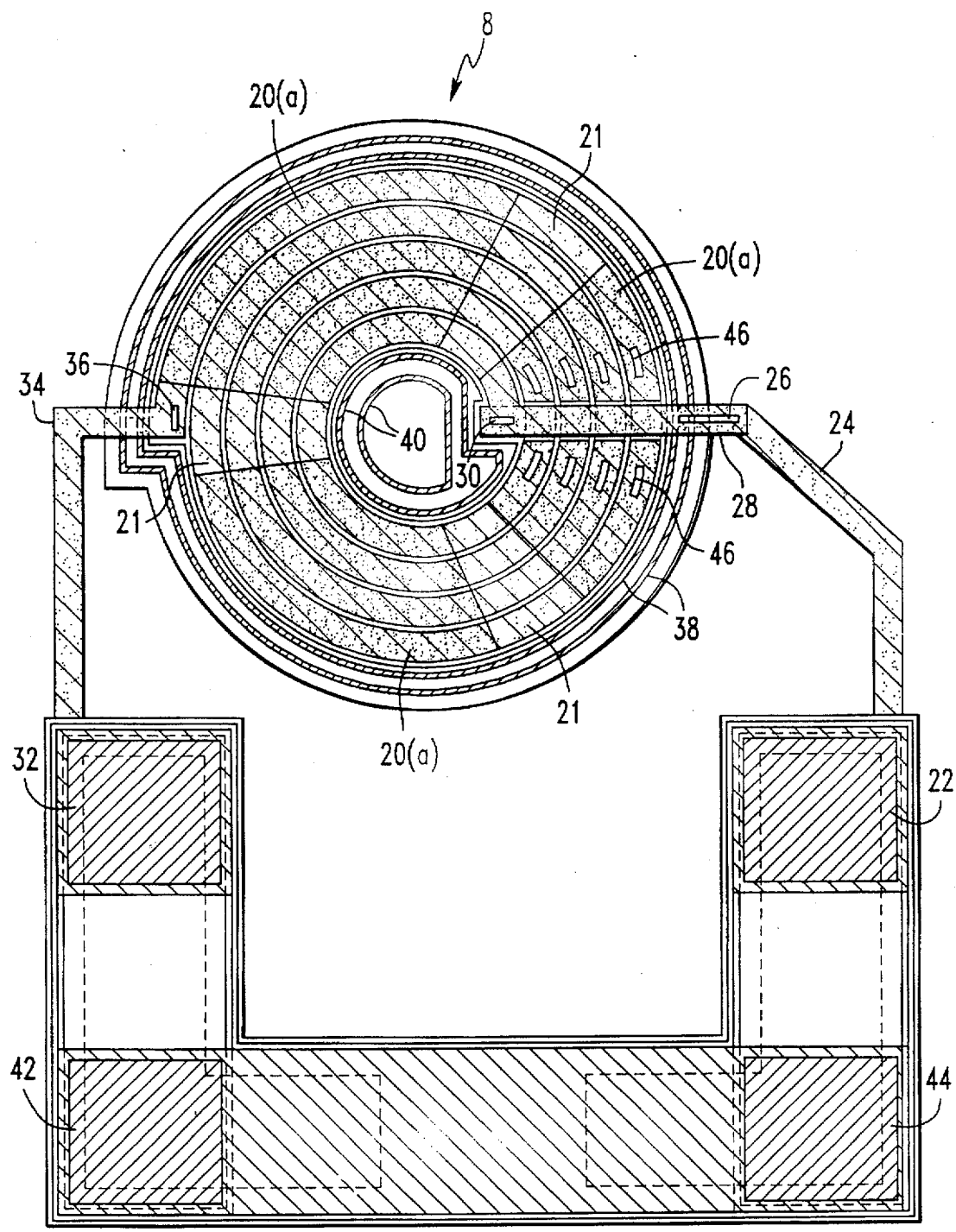
FIG. 3(a) is a plan-view of the integrated circuit with an inductor structure in accordance with the present invention.

Referring to FIG. 3(a), a plan-view of the patterning of the integrated circuit with the inductor structure 8 of the present invention is shown. Inductor structure 8 is formed on a bonded wafer and includes the following from bottom to top, a handle substrate 10, a bottom dielectric layer 12, a device layer 14, an upper dielectric layer 16, and a metal spiral 18. Device layer 14 may have an upper epitaxial layer 13. Each dielectric layer 12 and 16 may be composed of any type of dielectric material, such as silicon oxide. The general configuration for inductor structure 8 is shown in FIG. 1. Bottom dielectric layer 12 bonds device layer 14 to handle substrate 10. In the alternative, the present invention is also applicable to a non-bonded wafer having a single substrate structure. In a single substrate structure, there is no bottom dielectric layer 12 and the handle substrate 10 is also the device layer. The following description relates to the invention used in a bonded wafer, however it also can relate to the single substrate device whereby all features of the invention related to device layer 14 are present in a semiconductor device substrate. Elements 22, 32, 42 and 44 are test structures and may be omitted from the inductor structure 8.

Metal spiral 18 is a continuous metal strip having an inner end 30 at its center and increases in a radial direction by coiling outward to an outer end 36. Metal spiral 18 has a plurality of turns and may either have an approximately circular shape, as shown in FIG. 3(a), or one that is approximately square or approximately regular polygonal. The continuous metal strip may be composed of one metal or multiple metal strips in parallel. The metal spiral structure will be discuss later in more detail in reference to FIGS. 4(a) and 4(b).

Device layer 14 has doped strips 20(a) which extend radially from a central axis extending through the inductor structure. Strips 20(a) have inner and outer boundaries generally aligned below the inner and outer turns of metal spiral 18. Each of strips 20(a) are continuous in device layer 14 within its inner and outer boundaries. Strips 20(a) have high doping concentrations in device layer 14 and provide regions of low resistivity. For example, strips 20(a) are doped to a concentration of $10^{17}/cm^3$ to $10^{21}/cm^3$ with phosphorus, arsenic, antimony or boron ions. Separating adjacent strips 20(a) are lesser doped or undoped regions 21 which have a substantially higher resistivity than strips 20(a). In this manner, strips 20(a) and regions 21 define in device layer 14 alternating regions of low and high resistivity below metal spiral 18. Three strips are shown in FIG. 3(a), however other numbers of strips may be used. Optionally, outer trenches 38 and inner trenches 40 in device layer 14 may be added. Trenches 38 and 40 can act as dopant diffusion barriers, and are used here primarily to prevent dopant from diffusing into regions where it is not needed. They also contribute to directly preventing circumferential current flow.

The integrated circuit connects to outer end 36 of metal spiral 18 through metal line 34, and to inner end 30 of metal spiral 18 through metal line 28. Metal line 28 is connected to metal line 24 through via 26. Through these connections an electrical signal to metal spiral 18 may be applied via metal lines 24 and 34. Note that contacts 22 and 32 to metal lines 24 and 34, respectively, and contacts 42 and 44 are elements separate from inductor structure 8, and are test structures used for measuring the inductor performance.

Figure 2:
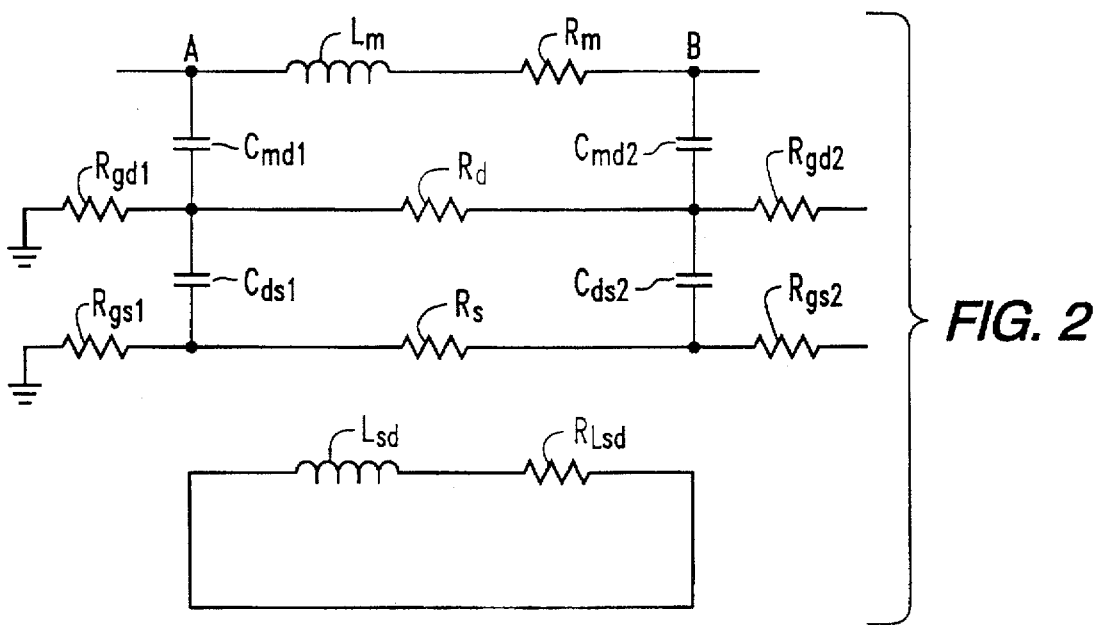
FIG. 2 is a schematic lumped-element model of the inductor structure of FIG. 1 showing the parasitics associated with the structure.

When a signal is applied to metal spiral 18, the current carried in the turns between outer end 36 and inner end 30 generates radial and circumferential current in device layer 14. These currents are parasitic and were described earlier in connection with FIGS. 1 and 2. The structure of strips 20(a) reduces the parasitic resistance $R_d$ to the radial current flow in device layer 14 because the radial direction of this current allows it to flows easily within each strip 20(a). In addition, regions 21 substantially maintain the resistance to the induced circumferential flow in device layer 14. Thus, parasitic resistance in device layer 14, $R_d$, is substantially reduced without significantly decreasing $R_{Lsd}$, which would have otherwise increased the induced circumferential current through both $R_{Lsd}$ and $L_{sd}$. This has a beneficial effect on the Q of metal spiral 18. By sufficiently reducing $R_d$, the real or resistive part of the impedance in the inductor structure of metal spiral 18 is lowered and Q is increased for most frequencies of operation. This reduction in Q may be represented as a reduction in power loss through $R_d$ since $P_d = I_d^2 R_d$, and because the parasitic radial current, $I_d$, is assumed to be essentially independent of $R_d$ at the doping concentrations of strips 20(a).

In addition to device layer 14, the current traveling in metal spiral 18 generates radial and circumferential current flows in handle substrate 10. Doped strips 20(a), by providing a low resistance path from below the outer and inner coil of metal spiral 18, also short-circuits the path of the radial current generated in substrate 10 through $R_s$. This substantially reduces parasitic current in substrate 10 and thus power loss through $R_s$, increasing the Q of the device.

In an alternative, regions 21 between radial doped strips 20(a) may be isolating trenches in device layer 14 (not shown in FIG. 3(a)), and in this manner obtain their high resistivity characteristic. These isolating trenches have walls coated with a dielectric, such as silicon oxide or silicon nitride, and a filling of polysilicon, preferably undoped, covering the trench walls.

Other alternatives to the inductor structure of FIG. 3(a) include: strip 20(a) being of one polarity dopant, such as N type, which reduces the resistance of device layer 14 to radial current, while regions 21 are doped with dopants of an opposite polarity, such as P type, which increases the resistance of device layer 14 to induced circumferential current; or regions 21 of device layer 14 being undoped while strips 20(a) are each doped around a central axis in alternating doping polarities.

Figure 3B:
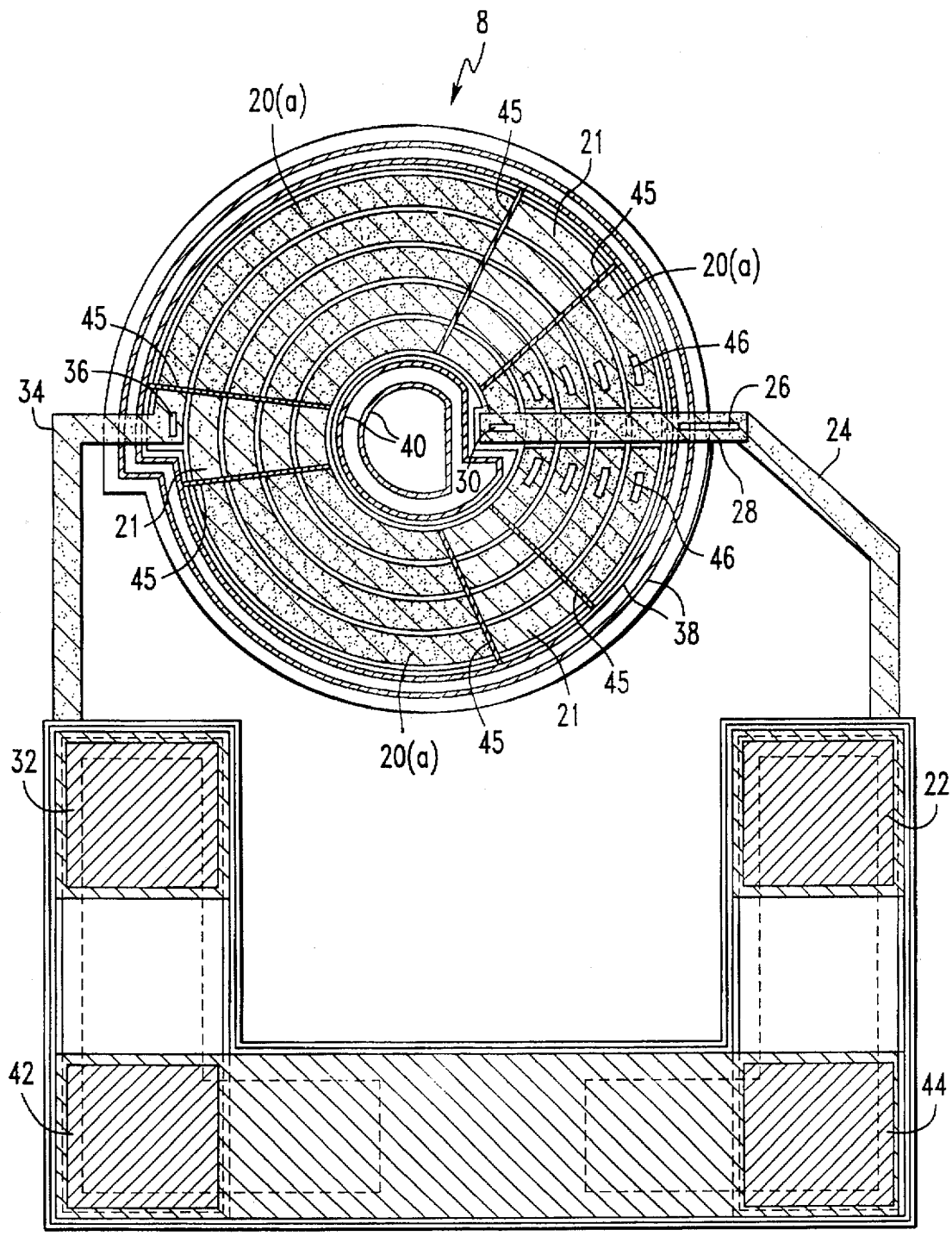
FIG. 3(b) is a plan-view of the integrated circuit, in accordance with an alternative embodiment of the inductor structure of FIG. 3(a).

Referring to FIG. 3(b), another alternative in the inductor structure of FIG. 3(a) is shown. All the features of FIG. 3(b) are the same as FIG. 3(a) except that radially oriented trenches 45 are added at the boundaries of strips 20(a) and regions 21. These trenches during formation of strips 20(a) prevent dopant from entering regions 21. During device operation, trenches 45 operate as a barrier to circumferential conduction by preventing carriers (electrons and holes) in strips 20(a) from spilling into regions 21. Trenches 45 have walls coated with a dielectric, such as silicon oxide or silicon nitride, and a filling of polysilicon, preferably undoped, covering the trench walls. Trenches 45 as shown here also help reduce circumferential current.

Note that strips 20 (a) in FIG. 3(a) are preferably wedges without a constant width, but other differently shaped strips may be used with a width which is more uniform. However, such differently shaped strips may not sufficiently reduce the resistance of device layer 14 to radial current or maintain the layer's resistance to induced circumferential current as desired.

Figure 4A:
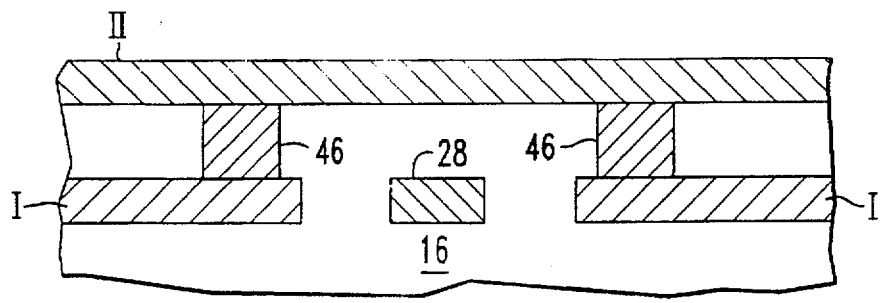
FIG. 4(a) is a cross-sectional view of a part of the inductor structure of FIG. 3(a).
Figure 4B:
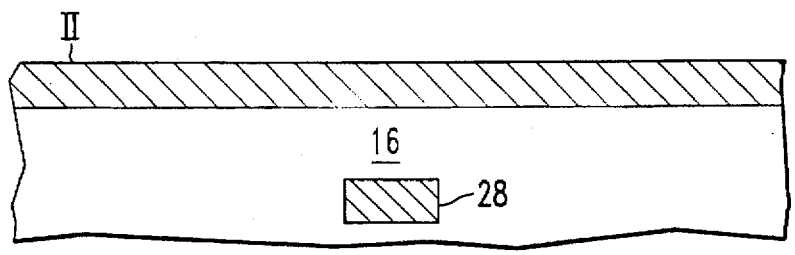
FIG. 4(b) is a possible variation of the same region shown in FIG. 4(a).

Referring now to FIG. 4(a), a cross-section of inductor structure 8 is shown in the vicinity of vias 46 and metal line 28 of FIG. 3(a). The continuous metal strip of metal spiral 18 is composed of two metal strips I and II. Metal strips I and II have the same number of turns and are parallel to each other. Metal strip II lies above metal strip I, and metal strip I is in the same horizontal plane as metal line 28. Metal strip II is continuous, while metal strip I is discontinuous in each of its turns on either side of metal line 28. Metal strips I and II are connected by vias 46. Vias 46 are located at the ends of metal strip I which resulted from metal strip I's discontinuity near metal line 28. Dielectric layer 16 supports metal I and also separates metal strips I and II. By using two metal strips I and II in metal spiral 18, metal spiral 18 is thickened. This reduces parasitic resistance $R_m$ of spiral 18, but may also increase the parasitic capacitance of inductor structure 8. Additional metal strips may be also be layered in dielectric layer 16 and connected with metal strips I and II to provide higher numbers of layers in spiral 18. Accordingly, metal spiral 18 may have one or multiple strips of metal. The use of only one metal strip is shown in the cross-section of the inductor structure of FIG. 4(b). Vias 46 shown in FIG. 3(a) are absent in the single metal strip case, and metal line 28 below single metal strip II are separated by dielectric layer 16.

Figure 5:
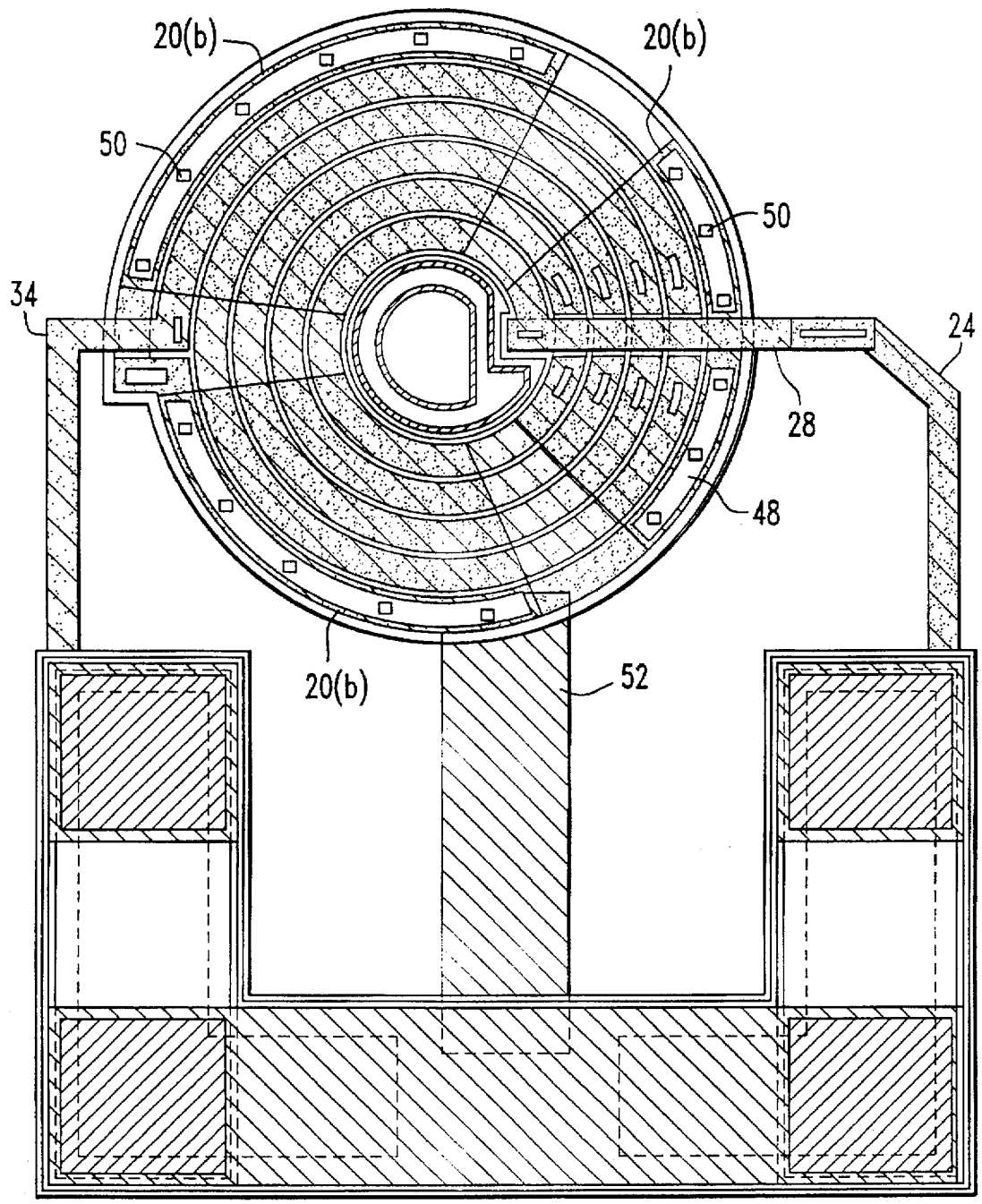
FIG. 5 is a plan-view of the integrated circuit with an inductor structure in accordance with a second embodiment of the present invention.

Referring to FIG. 5, the integrated circuit with an inductor structure of the second embodiment of the present invention is shown. All the features of FIG. 5 are identical with inductor structure 8 of FIG. 3(a), except optional outer trenches 38 are absent and strips 20(a) have been radially extended outward to define strips 20(b). Added to the inductor structure is a metal line 48 over dielectric layer 16, extending in an incomplete ring around the outer circumference of metal spiral 18 over the extended portions of strips 20(b). Metal line 48 has multiple connections with strips 20(b) at metal filled apertures 50 in dielectric layer 16. Also added to the inductor structure is a metal lead 52 which connects metal line 48 to the ground reference voltage of the IC. Note that due to metal line 48, metal line 28 is outwardly extended under metal line 48. Furthermore, metal line 34 does not contact metal line 48 while running under or over metal line 48.

Metal line 48, also referred to as a ground line, couples the outer circumference of strips 20(b) to a ground reference to reduce the resistance to parasitic current in device layer 14 which dissipates by flowing in layer 14 to ground, i.e., parasitic resistance $R_{gd}$. The reduced resistivity of strips 20(b) allows the parasitic current to flow easily from device layer 14 to metal line 48. This reduces the power loss through $R_{gd}$, thereby reducing Q. Also, by reducing $R_{gd}$ the parasitic current through $R_{gs}$ in handle substrate 10 to ground is short-circuited by the current path to ground through device layer 14. This reduces power loss through $R_{gs}$, thereby increasing Q.

Figure 6:
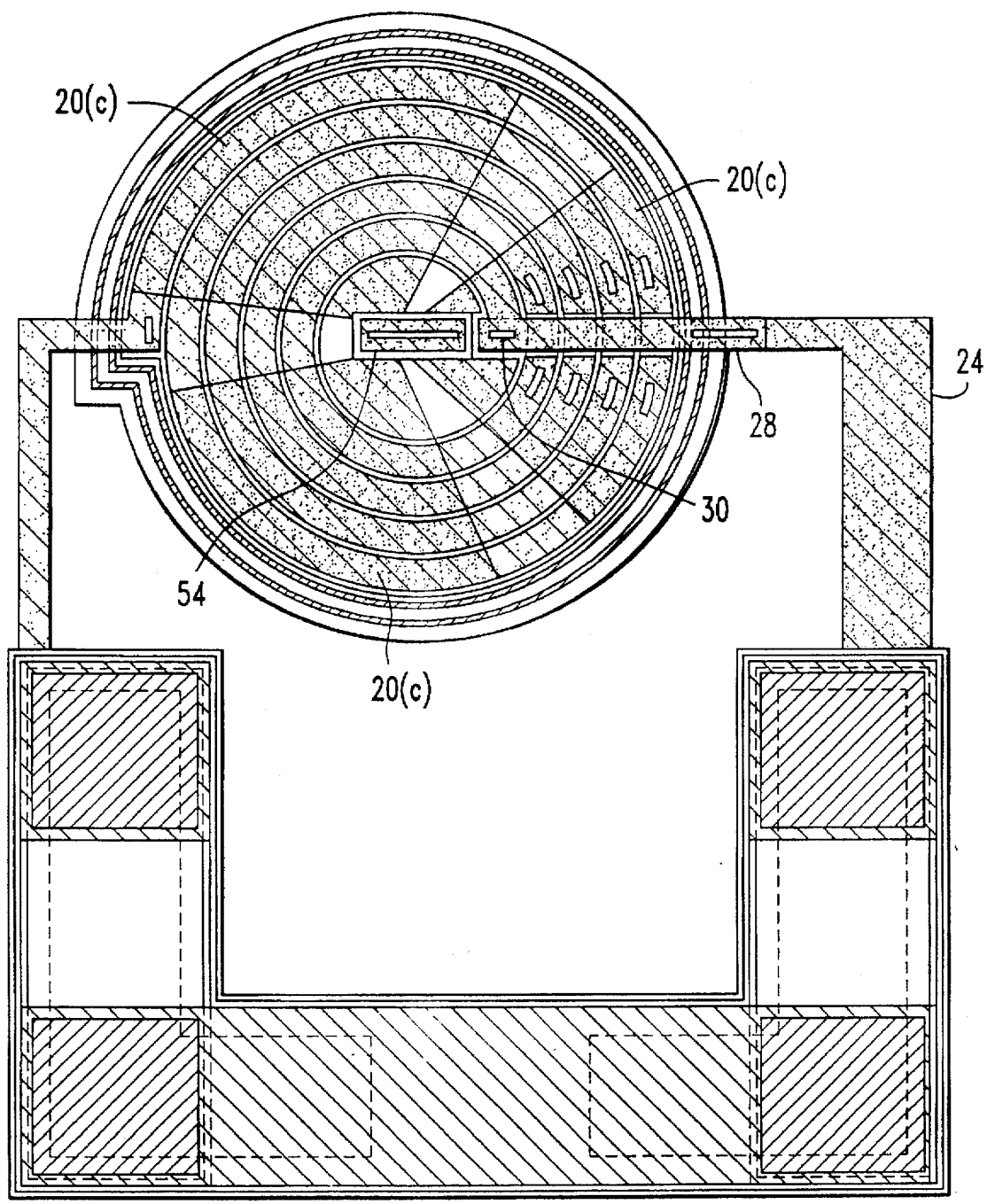
FIG. 6 is a plan-view of the integrated circuit with an inductor structure in accordance with a third embodiment of the present invention.

Referring to FIG. 6, the integrated circuit with an inductor structure of the third embodiment of the present invention is shown. All the features of FIG. 6 are identical with the inductor structure of FIG. 3(a), except inner trenches 40 are absent and strips 20(a) have been radially extended inward to define strips 20(c). Added to inductor structure 8 is a connection 54 from the extended portion of each strip 20(c) to one end of metal line 28, which is inwardly extended to meet connection 54. The other end of metal line 28 connects to metal line 24. Metal line 24 as shown is widened in FIG. 6 for measurement purposes only. Inner end 30 of spiral 18 connects to the inward extension of metal line 28 near connection 54. Since metal spiral 18 at its inner end 30 should be near a ground voltage level, connecting inner end 30 to strips 20(c) has the effect of coupling the radial center of strips 20(c) to a voltage level near ground. This produces an effect similar to metal line 48 of FIG. 5 in reducing power loss through $R_{gs}$.

Figure 7:
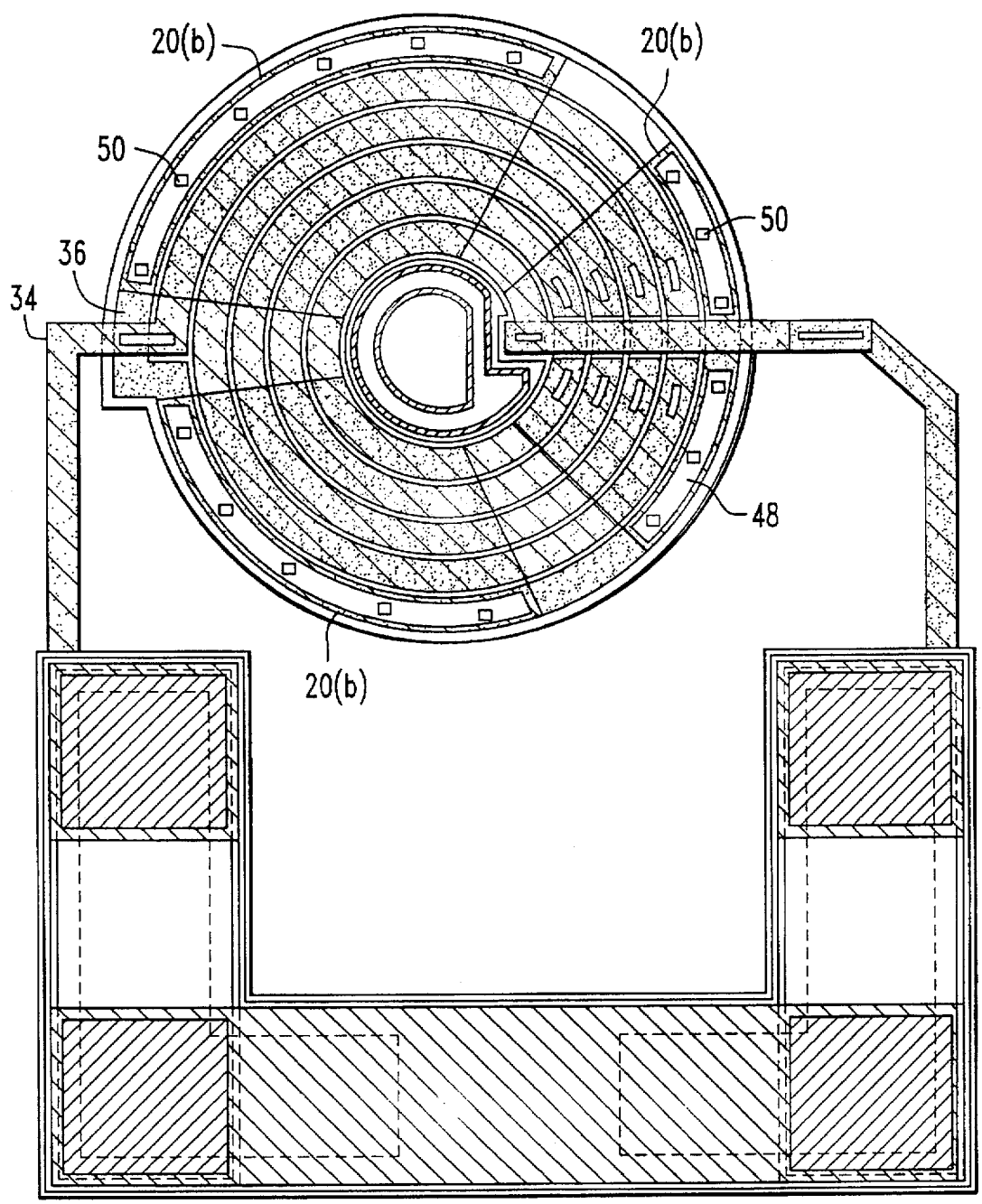
FIG. 7 is a plan-view of the integrated circuit with an inductor structure in accordance with a fourth embodiment of the present invention.
Figure 9A:
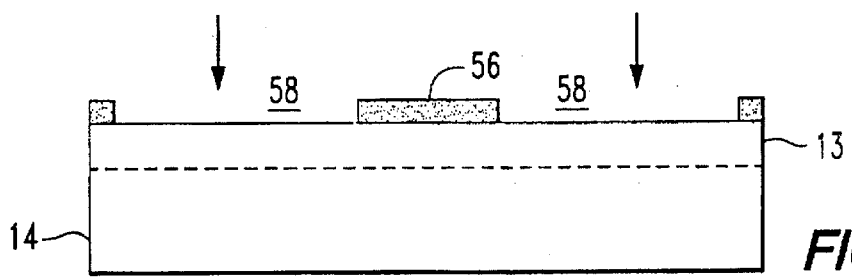
FIGS. 9(a–f) are cross-sectional diagrams illustrating the fabrication of the inductor structure in accordance with the present invention.
Figure 9B:
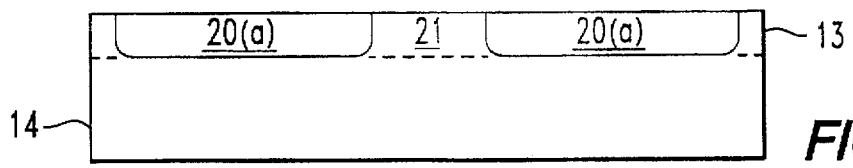
Figure 9C:
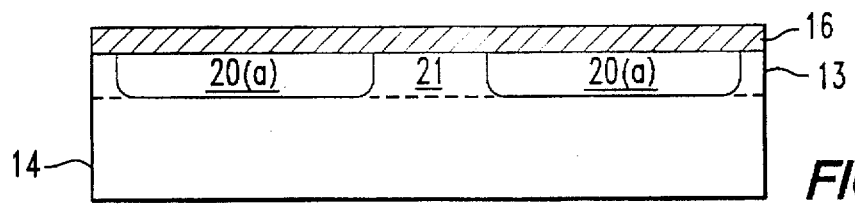
Figure 9D:
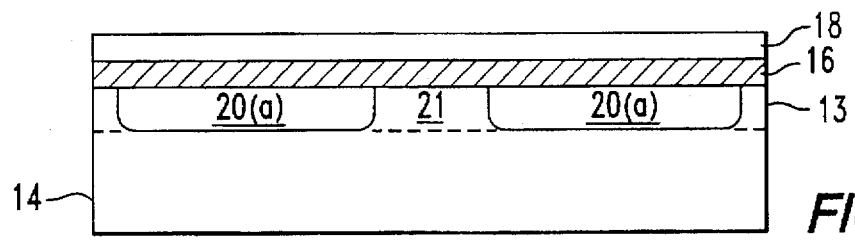
Figure 9E:
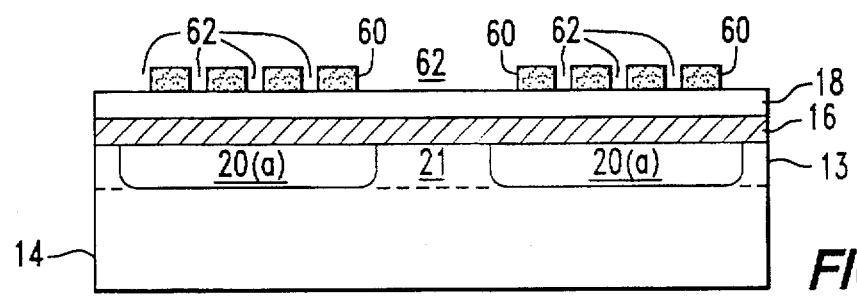
Figure 9F:
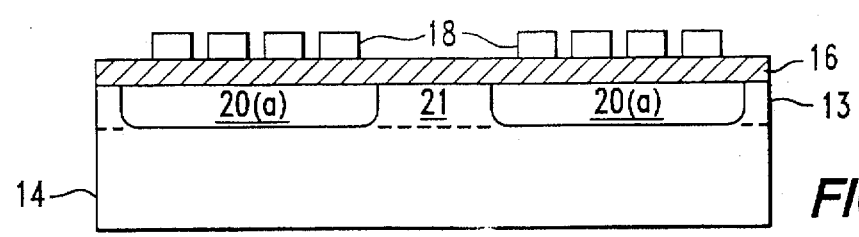
Figure 10A:
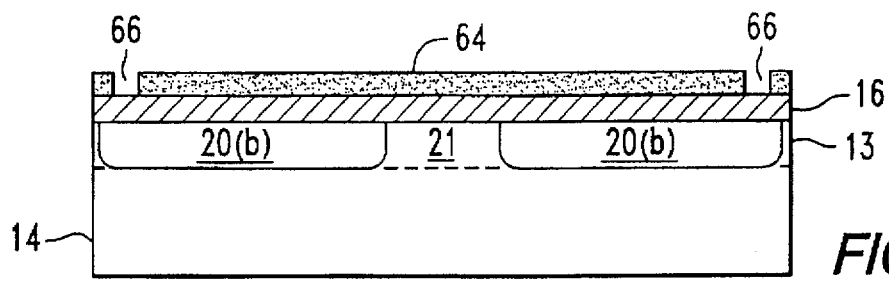
FIGS. 10(a–e) are cross-sectional diagrams illustrating the fabrication of the inductor structure in accordance with the second embodiment of the present invention, which are performed after steps shown in FIGS. 9(a–c), except in FIG. 9(a) openings 58 in mask 56 are wider to provide doped strips 20(b).
Figure 10B:
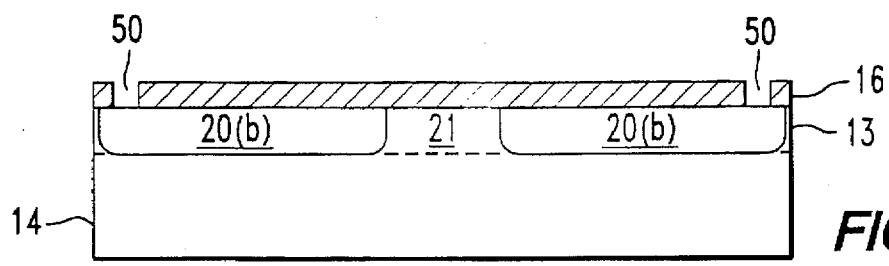
Figure 10C:
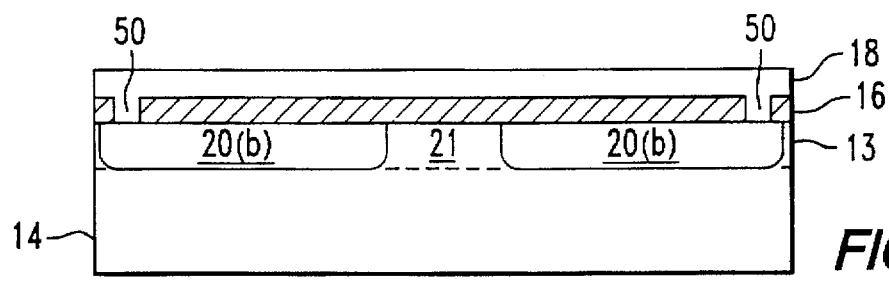
Figure 10D:
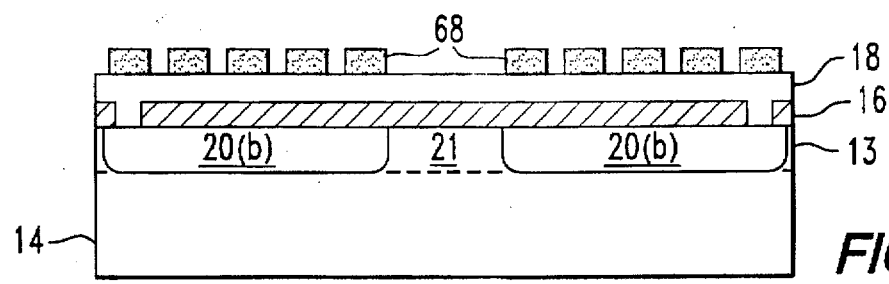
Figure 10E:
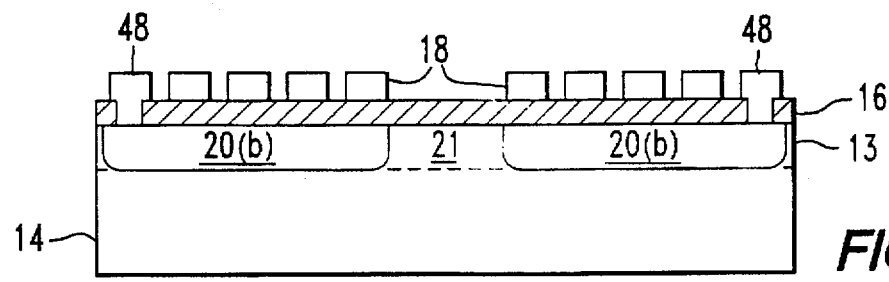

Referring to FIG. 7, the integrated circuit with an inductor structure of the fourth embodiment of the present invention is shown. All the features of FIG. 7 are identical with the inductor structure of FIG. 5, except metal lead 52 is absent, metal line 48 is not connected to a ground voltage reference by arm 52, and outer end 36 of metal spiral 18 is connected to both metal lines 34 and 48. Since metal spiral 18 at its outer end 36 should be near a ground voltage level, connecting outer end 36 to strips 20(b) has the effect of coupling the outer circumference of strips 20(b) to a voltage level near ground. This produces an effect similar to metal line 48 of FIG. 5 in reducing power loss through $R_{gs}$.

Referring now to FIGS. 9(a-f), the fabrication of an integrated circuit with an inductor structure of the present invention will be described. The fabrication is in reference to the invention on single semiconductor device substrate, such as device layer 14, which has epitaxial layer 13 and no handle substrate 10 and no bottom oxide 12. Epitaxial layer 13 is masked with a first mask 56, such as a photo-resist, to define openings 58 for exposing strips 20(a) about a central axis which extends through epitaxial layer 13 (FIG. 9(a)). Next, epitaxial layer 13 exposed by mask 56 is doped, as represented by arrows in FIG. 9(a), to form strips 20(a). Doping may be accomplished by predeposition or ion implantation. It is then diffused during subsequent diffusion steps. Typical dopants are arsenic, boron, antimony, and phosphorous. The result after mask 56 is removed is shown in FIG. 9(b). This creates in epitaxial layer 13 adjacent regions of low resistivity, i.e., strips 20(a), and high resistivity 21. After strips 20(a) are created, a dielectric layer 16 is formed over epitaxial layer 13 (FIG. 9(c)). A metal layer 18 is then deposited over dielectric layer 16 over the regions of low 20(a) and high 21 resistivity (FIG. 9(d)). To pattern metal spiral 18, a second mask 60 masks metal layer 18 to define openings 62 over metal layer 18 FIG. 9(e). Afterwards, the regions of metal layer 18 exposed by mask 60 are removed and then mask 60 is removed. This provides metal spiral 18 shown in FIG. 9(f).

In the above fabrication process, masks may be provided by photo-resist and removal of masks by etching, however other standard techniques may be used. Also, during the above process contacts may be formed to metal spiral 18 at inner end 30 and outer end 36, as well as metal lines 26, 24 and 34 to these contacts (shown in FIG. 3(a)). Further, the above process describes a single metal strip forming spiral 18, however spiral 18 can also be formed by multiple metal strips, as described earlier.

FIGS. 10(a–e) illustrate fabrication of the inductor structure in accordance with the second embodiment of this invention. Fabrication is identical with FIGS. 9(a–c), except in FIG. 9(a) openings 58 in mask 56 are outwardly wider to provide doped strips 20(b). After FIG. 9(c), a mask 64 is placed over dielectric layer 16 to define openings 66. Afterwards, the regions of dielectric layer 18 exposed by mask 64 are removed, and then mask 64 is removed. This forms apertures 50 to strips 20(b) (FIG. 10(b)). Metal layer 18 is deposited over dielectric layer 16 and fills apertures 50 (FIG. 10(c)). Thus, metal layer 18 contacts strips 20(b) through the metal deposited in apertures 50. Next, a mask 68 is placed over metal layer 18 to pattern metal spiral 18 and metal line 48. The regions of metal layer 18 exposed by mask 68 are then removed to form metal line 48 and metal spiral 18, as shown in FIG. 10(e). During the above processing, a ground voltage contact, i.e., metal lead 52, may be formed over dielectric layer 16, and metal line 48 then connected to the ground voltage contact 52 (as shown in FIG. 5).

Fabrication for the third embodiment of this invention, is the same as described in connection with FIGS. 9(a–f), except inner end 30 of metal spiral 18 is connected to strips 20(c) in epitaxial layer 13 by connection 54.

Fabrication for the fourth embodiment is the same as for the second embodiment, except no reference voltage contact is formed and metal line 48 is not connected to the reference voltage contact. Instead, metal line 48 is connected to inner end 36 of metal spiral 18.

The above also applies to the bonded wafer case. In the bonded wafer, the above semiconductor substrate can be bonded to handle substrate 10 with bottom dielectric layer 12 disposed therebetween. The bonding operation is performed prior to the formation of the inductor structure.

Figure 8:
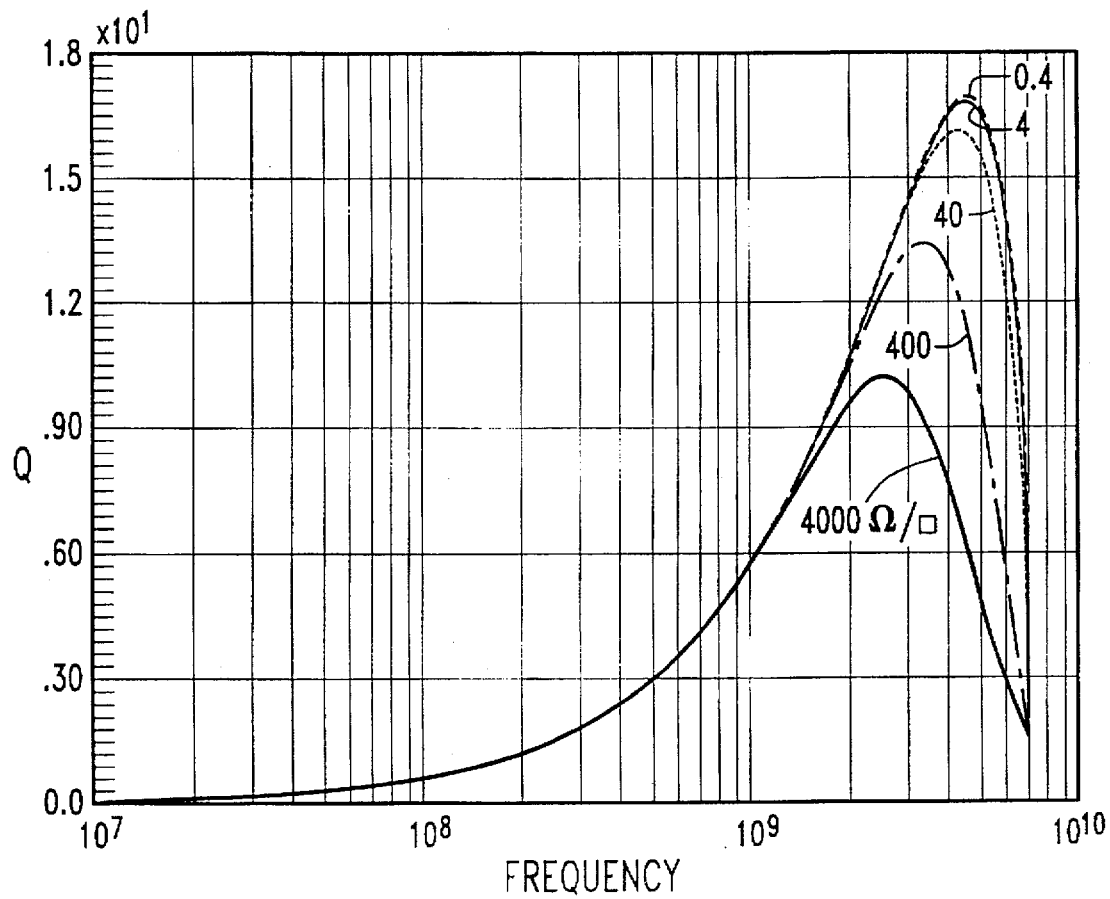
FIG. 8 is a graphical simulation of the operation of the inductor structure of FIG. 3(a).

Simulation of the inductor structure in SPICE is shown in graph FIG. 8. The vertical axis of the graph is Q and the horizontal axis is frequency of the electrical signal being carried in metal spiral 18. The curves on the graph represent the resistivity of the epitaxial layer resistivity at different doping levels. These resistivities are at 4000, 400, 40, 4 and 0.4 Ohms/square, and each curve is labeled with its corresponding resistivity. In this simulation, metal spiral 18 has 4.5 turns and uses both metal strips I and II. Further, resistivity of the handle substrate 10 is 14 Ohm-cm. The purpose of this graph is to show the effect on Q by reducing the resistivity of epitaxial layer 13, $R_d$, when $R_{Lsd}$ is maintained the same. This will be the case because strips 20(a, b, and c) do not significantly effect $R_{Lsd}$ while reducing $R_d$, as previously described.

On the graph, the lowest curve corresponds to a low-doped epitaxial layer 13 of 4000 ohms/square, i.e., without strips 20 (a, b, and c). This current has a peak Q of about 10. The graph shows that if $R_d$ is decreased by two orders-of-magnitude to 40 Ohms/square, then the maximum Q can be increased by about 60%, and that any further reduction in $R_d$ will have little effect. This differs from the prior art approach of doping the device layer 14 without the strips because as resistivity of epitaxial layer 13 decreases, the peak Q values shown in the graph would be lower because $R_{Lsd}$ is decreasing, which causes an increase in the induced circumferential current, power loss through $R_{Lsd}$ and an increase in the magnetic field of $L_{sd}$ which opposes the magnetic field of metal spiral 18. In the present invention, strips 20(a,b, and c) do not significantly decrease $R_{Lsd}$, and hence do not allow for an increase in current through $L_{sd}$ and $R_{Lsd}$. Thus, Q is substantially increased, as shown in the graph.

From the foregoing description, it will be apparent that there has been provided improved system, method and apparatus for an integrated circuit with an improved inductor structure. Variations and modifications in the herein described systems, in accordance with the invention, will undoubtedly suggest themselves to those skilled in the art. Accordingly, the foregoing description should be taken as illustrative and not in a limiting sense.

I claim:

1. An integrated circuit with an inductor structure comprising:

a semiconductor device substrate;

a dielectric layer over said semiconductor device substrate;

a metal spiral over said dielectric layer comprising a continuous metal strip having at one end a center and increasing in a radial direction to the other end, said spiral carrying current between its two ends and generating radial and circumferential currents in said semiconductor device substrate; and a plurality of radial doped strips in said semiconductor device substrate about a central axis, each radial doped strip defining a region of relatively low resistivity to reduce the resistance to the radial current flow in said semiconductor device substrate, and said strips being separated by regions having relatively high resistivity to substantially maintain the resistance to the circumferential current flow in the semiconductor device substrate.

2. The integrated circuit according to claim 1 wherein:

said metal spiral has a plurality of turns, including innermost and outermost turns; and said plurality of radial doped strips having inner and outer boundaries generally aligned with said innermost and outermost turns of said metal spiral.

3. The integrated circuit according to claim 1 wherein:

said reduced resistance to the radial current flow in said semiconductor device substrate is sufficient to lower the resistive part of the impedance in said inductor structure of the metal spiral, thereby increasing the Q of the metal spiral.

4. The integrated circuit according to claim 1 further comprising:

means for coupling at least one site of said doped strips in said semiconductor device substrate to a voltage level at ground or near ground to reduce resistance to parasitic current flowing through the semiconductor device substrate to ground.

5. The integrated circuit according to claim 4 wherein:

said ground coupling means is sufficient to lower the resistive part of the impedance in the inductor structure of the metal spiral, thereby increasing the Q of the metal spiral.

6. The integrated circuit according to claim 4 wherein said metal spiral has an outer circumference, said ground coupling means comprises:

a metal line over said dielectric layer extending in an incomplete ring around the outer circumference of said metal spiral, said metal line being electrically connectable to ground and having at least one connection with each of said doped strips in said semiconductor device substrate.

7. The integrated circuit according to claim 1 further comprising:

means for coupling at least one site of said doped strips in said semiconductor device substrate to a voltage level near ground to reduce parasitic resistance to current flowing through the semiconductor device substrate to ground.

8. The integrated circuit according to claim 7 wherein:

said means is sufficient to lower the resistive part of the impedance in the inductor structure of the metal spiral, thereby increasing the Q of the metal spiral.

9. The integrated circuit according to claim 7 wherein said two ends of said metal spiral define an inner and an outer end, said means comprises:

a connection between said doped strips in said semiconductor device substrate and the inner end of said metal spiral.

10. The integrated circuit according to claim 7 wherein said two ends of said metal spiral define an inner and an outer end, said means comprises:

a metal line over said dielectric layer extending in an incomplete ring around the outer circumference of said metal spiral, said metal line having at least one connection with each of said doped strips in said semiconductor device substrate; and a connection between said metal line and the outer end of said metal spiral.

11. The integrated circuit according to claim 1 further comprising:

a handle substrate bonded to the semiconductor device substrate.

12. The integrated circuit according to claim 11 wherein:

said current being carried between the two ends of the metal spiral generates radial and circumferential currents in the handle substrate; and said radial current flow in said handle substrate is reduced by being short circuited by said semiconductor device substrate.

13. The integrated circuit according to claim 12 wherein:

said reduced radial current flow in said handle substrate is sufficient to lower the resistive part of the impedance in the inductor structure to the metal spiral, thereby increasing the Q of the metal spiral.

14. An integrated circuit with an inductor structure comprising:

a semiconductor substrate;

a dielectric layer over of said semiconductor substrate;

a metal spiral over said dielectric layer comprising a continuous metal strip having at one end a center and increasing in radial direction to the other end, said spiral carrying current between its two ends and generating radial and circumferential current in said semiconductor substrate; and means for reducing the resistance of parasitic radial current flow in the semiconductor substrate while substantially maintaining the resistance to the circumferential current flow in the semiconductor substrate.

15. The integrated circuit according to claim 14 wherein said means comprises:

a plurality of radial doped strips in said semiconductor substrate about said central axis, said radial doped strips defining separate regions of relatively low resistivity to reduce the resistance to the parasitic radial current flow in said semiconductor substrate, and said strips being separated from the undoped strips by isolating trenches to substantially maintain the resistance to the induced circumferential current flow in the semiconductor substrate.

16. The integrated circuit according to claim 15 wherein:

said trenches have walls coated with a dielectric, and a filling of polysilicon covering said walls.

17. The integrated circuit according to claim 14 wherein said means comprises:

a plurality of radial doped strips in said semiconductor substrate about said central axis, said radial doped strips defining separate regions of one polarity dopant to reduce the resistance to the radial current flow in said semiconductor substrate, and said strips being separated by regions doped with dopants of an opposite polarity to substantially maintain the resistance to the circumferential current flow in the semiconductor substrate.

18. The integrated circuit according to claim 14 further comprising:

means for coupling at least one site of said semiconductor substrate to a voltage level at or near ground.

19. The integrated circuit according to claim 14 wherein said means comprises:

a plurality of radial doped strips in said semiconductor substrate about said central axis, said radial doped strips defining separate regions and being each doped around the central axis in alternating doping polarities to reduce the resistance to the radial current flow in said semiconductor substrate, and said strips being separated by undoped regions to substantially maintain the resistance to the circumferential current flow in the semiconductor substrate.

20. The integrated circuit according to claim 14 wherein said means comprises:

a plurality of radial doped strips in said semiconductor device substrate about a central axis, each radial doped strip defining a region of relative low resistivity to reduce the resistance to the radial current flow in said semiconductor device substrate, and said strips being separated by regions having relatively high resistivity to substantially maintain the resistance to the circumferential current flow in the semiconductor device substrate; and trenches in said semiconductor device substrate at boundaries between said doped strips and said regions separating said doped strips, said trenches comprising a dielectric material.

21. A method for fabricating an integrated circuit with an inductor structure having a semiconductor substrate, said method comprising the steps of:

masking said semiconductor substrate with a first mask to define exposed radial strips about a central axis extending through said semiconductor substrate;

doping said exposed radial strips to create adjacent regions of low resistivity and high resistivity;

removing said first mask;

forming a dielectric layer over said semiconductor substrate;

depositing a metal layer over the region of low and high resistivity; and patterning the metal layer into a spiral.

22. The method according to claim 21 further comprising the steps of:

forming a reference voltage contact over said dielectric layer;

forming apertures in the dielectric layer;

depositing metal in the apertures to contact the doped strips of the semiconductor substrate;

forming a metal line over said dielectric layer which is shaped in an incomplete ring around the outer circumference of said metal spiral and has a plurality of connections along said incomplete ring to said metal deposited in said apertures; and connecting said metal line with the reference voltage contact.

23. The method according to claim 21 wherein said metal spiral has an inner and an outer end, and said method further comprises the step of:

connecting the inner end of said metal spiral to at least one of each of said doped strips in said semiconductor substrate.

24. The method according to claim 21 wherein said metal spiral has an inner and an outer end, and said method further comprises the steps of:

forming apertures in the dielectric layer;

depositing metal in the apertures to contact the doped strips of the semiconductor substrate;

forming a metal line over said dielectric layer which is shaped in an incomplete ring around the outer circumference of said metal spiral and has a plurality of connections along said incomplete ring to said metal deposited in said apertures; and connecting said metal line to the outer end of said metal spiral.

25. The method according to claim 21 further comprising the step of bonding the semiconductor substrate to a handle substrate with a dielectric layer disposed between the substrate and the handle.

* * * * *